(12) United States Patent
Wu (10) Patent No.: US 7,355,473 B2
(45) Date of Patent: Apr. 8, 2008

(54) FILTERLESS CLASS D POWER AMPLIFIER

(75) Inventor: Kuo-Hung Wu, Tainan County (TW)

(73) Assignee: Amazion Electronics, Inc., Hsinhua, Tainan County (TW)

( * ) Notice: Subject to any disclaimer, the term of this patent is extended or adjusted under 35 U.S.C. 154(b) by 215 days.

(21) Appl. No.: 11/163,897

(22) Filed: Nov. 3, 2005

(65) Prior Publication Data
US 2007/0109049 A1   May 17, 2007

(51) Int. Cl.
H03F 3/38      (2006.01)
H03F 3/217    (2006.01)
(52) U.S. Cl. .................................. 330/10; 330/207 A
(58) Field of Classification Search ................. 330/10, 330/207 A, 251
See application file for complete search history.

(56) References Cited

U.S. PATENT DOCUMENTS

| | | | |
|---|---|---|---|
| 5,672,998 A | 9/1997 | Wittlinger | 330/10 |
| 5,805,020 A | 9/1998 | Danz et al. | 330/10 |
| 6,249,182 B1 | 6/2001 | Pullen | 330/10 |
| 6,262,632 B1* | 7/2001 | Corsi et al. | 330/251 |
| 6,420,930 B1 | 7/2002 | Takagishi | 330/251 |
| 6,614,297 B2 | 9/2003 | Score et al. | 330/10 |

\* cited by examiner

*Primary Examiner*—Steven J. Mottola
(74) *Attorney, Agent, or Firm*—Jianq Chyun IP Office (57) ABSTRACT

A double reference wave modulation scheme for filterless power amplifiers is disclosed for reducing EMI. In the filterless power amplifier, differential outputs for driving load impedance are corrected based on input audio signals by the error amplifier. Reference wave generators generate reference waves. Comparators are responsive to the reference waves and the input audio signal. Operation states of the switching unit are decided based on output signals of the comparators and the switching unit output the differential output. Besides, a feedback unit feeds the differential output back to the error amplifier. By this configuration, complex control logic is not needed.

18 Claims, 10 Drawing Sheets

FILTERLESS CLASS D POWER AMPLIFIER

BACKGROUND OF THE INVENTION

1. Field of Invention

This invention relates generally to filterless amplifiers, and more particularly, to a double reference waves filterless modulation scheme for filterless amplifiers and method thereof to reduce EMI (Electronic-Magnetic Interference).

2. Description of Related Art

Class-D audio power amplifiers are two to five time more efficient than class-AB audio power amplifiers. Because of their greater efficiency, class-D amplifiers require smaller power supplies and eliminate heat sinks, significantly reducing overall system costs, size and weight.

Class D audio power amplifiers convert audio signals into high-frequency pulses that switch the output in accordance with the audio input signal. Some class D amplifier use pulse width modulators (PWM) to generate a series of conditioning pulses that vary in width with the audio signal's amplitude. The varying-width pulses switch the power-output transistors at a fixed frequency. Other class D amplifiers may rely upon other types of pulse modulators. For heuristic purposes, the following discussion will mainly refer to pulse width modulators, but those skilled in the art will recognize that class D amplifiers may be configured with other types of modulators.

Figure 1:
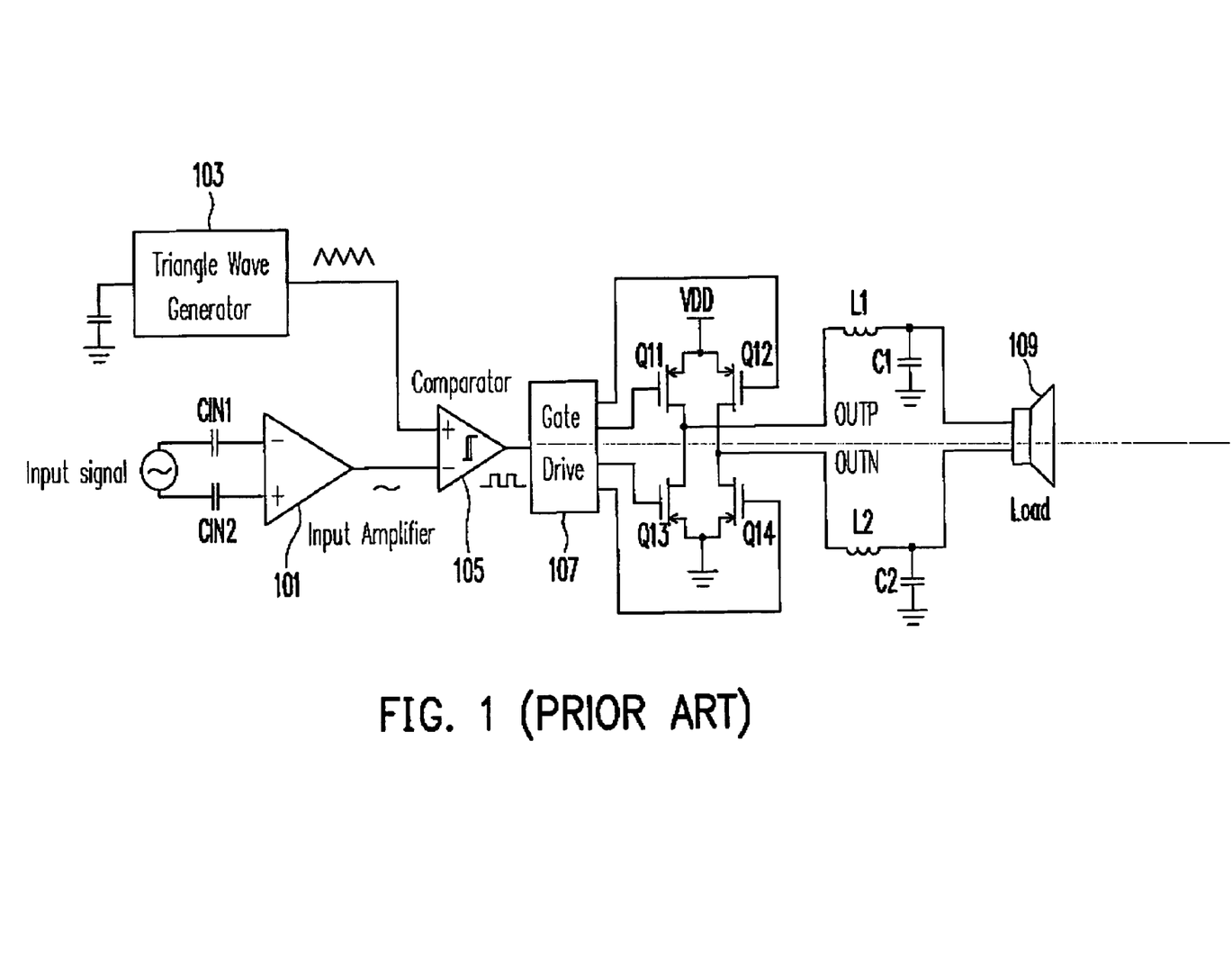
FIG. 1 is a diagram of a Class D amplifier familiar in the known art.

FIG. 1 shows a Class D amplifier familiar to those skilled in the art. The input audio signal is input into an input amplifier 101 via capacitors CIN1 and CIN2. Then, a comparator 105 compares outputs from amplifier 101 at the negative input and the triangular waves, generated from a triangular wave generator 103, at the positive input to generate PWM signals. PWM signals are input into a gate drive 107 for driving transistors Q11~Q14. Differential outputs OUTP and OUTN of the class D amplifier are respectively fed into low-pass filters (formed by an inductor L1 and a capacitor C1 and an inductor L2 and a canacitor C2) that convert the pulses back into an amplified audio signal for driving one or more loads 109 (for example, audio speakers).

The traditional class D amplifiers have differential outputs (OUTP and OUTN) wherein each output is complementary and has a swing range from ground to VDD.

Figure 2A:
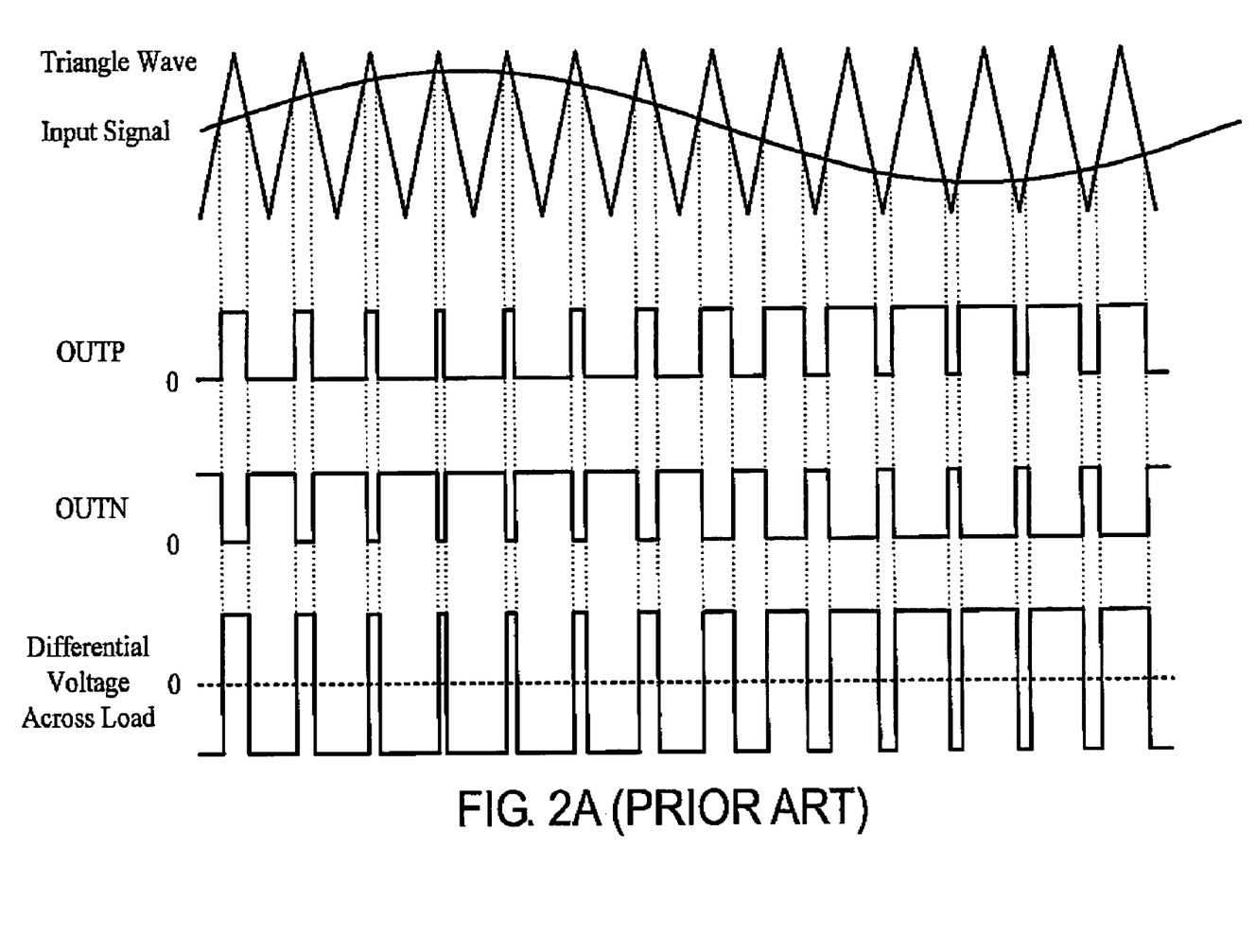
FIGS. 2A~2C are waveforms of FIG. 1 when the input signal is large, small and zero, respectively.
Figure 2B:
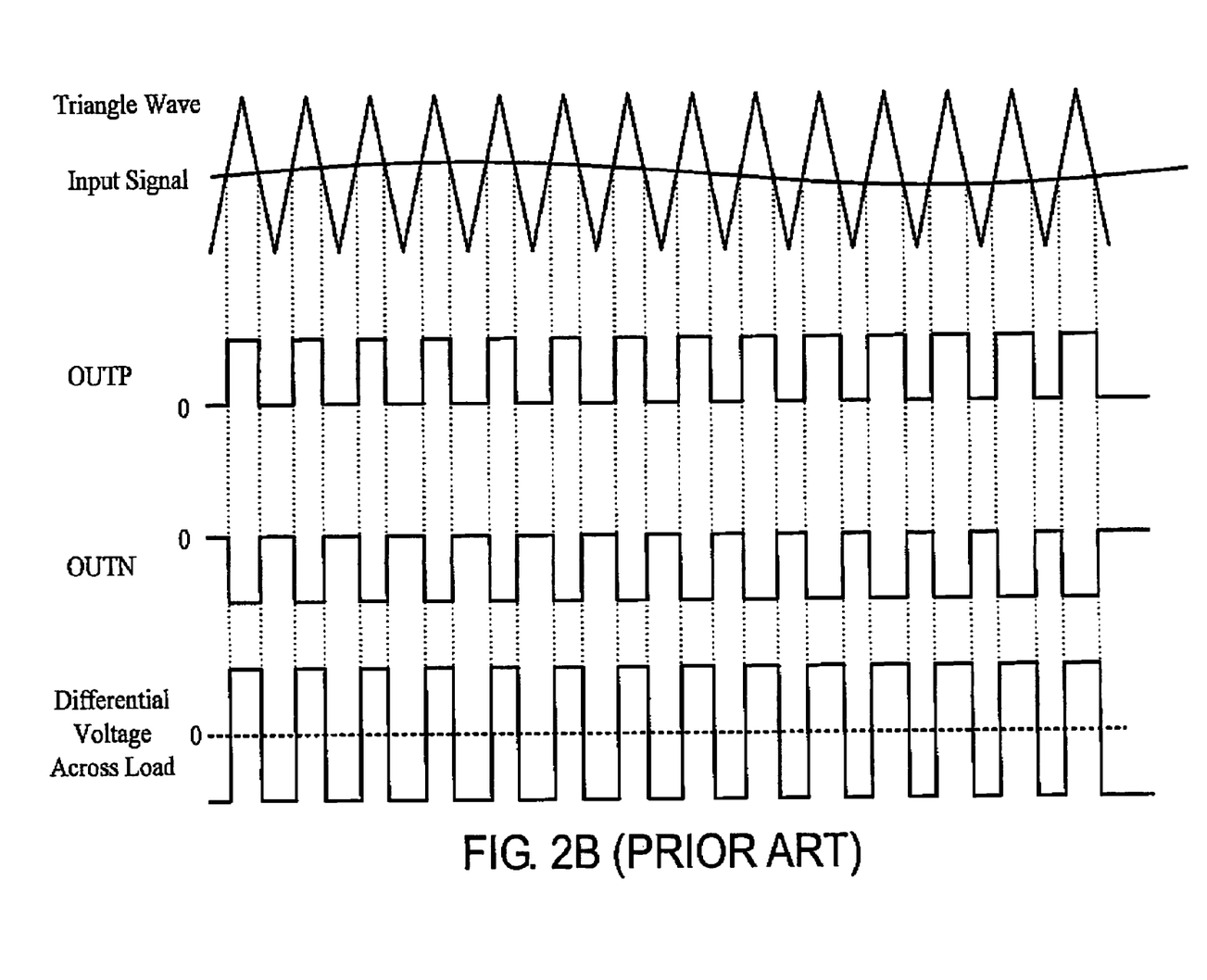
Figure 2C:
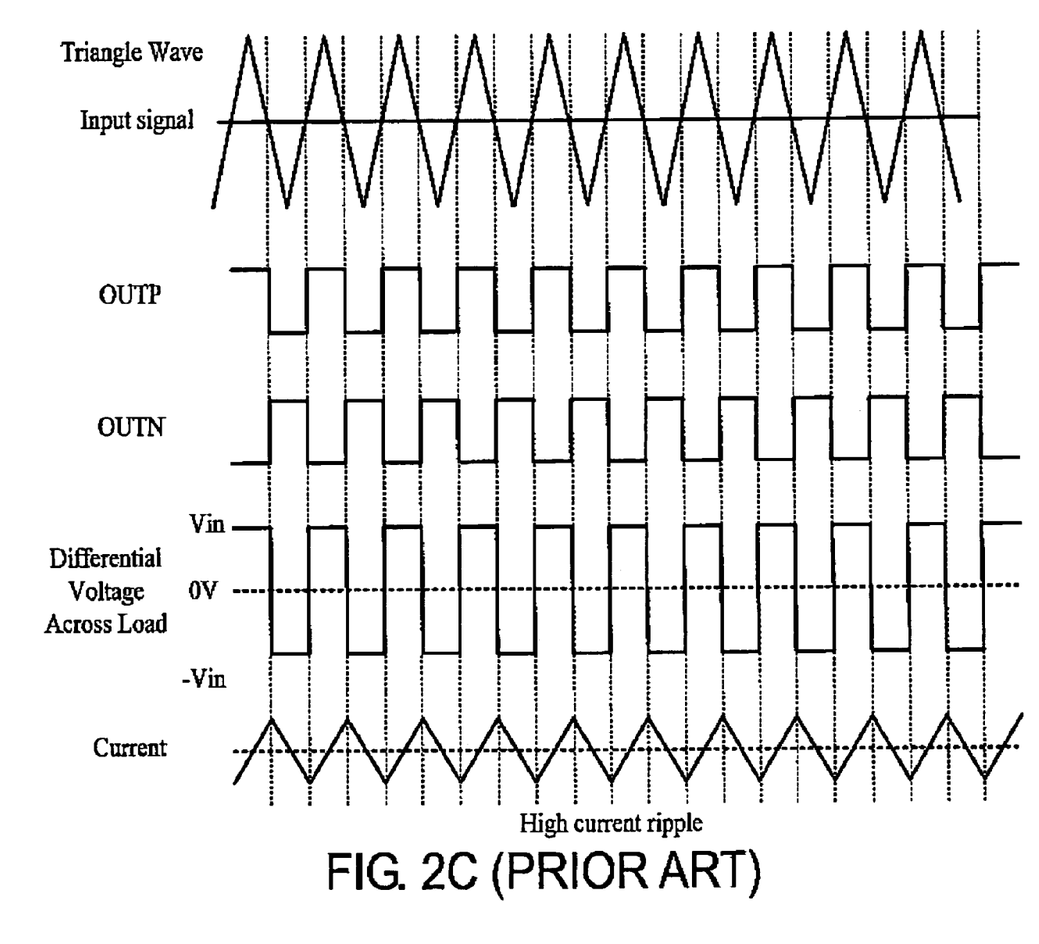

FIGS. 2A~2C show the waveforms when the input signal is large, small and zero, respectively. In FIG. 2C, large output ripple currents are caused. For reducing the large output ripple currents, a large LC filter is needed, as shown in FIG. 1.

When the input signal is zero or very small, the traditional class D amplifier has a differential voltage across load with almost 50% duty cycle. This 50% duty cycle sinks and sources large currents through the load (the speaker), resulting additional power consumption.

Figure 3:
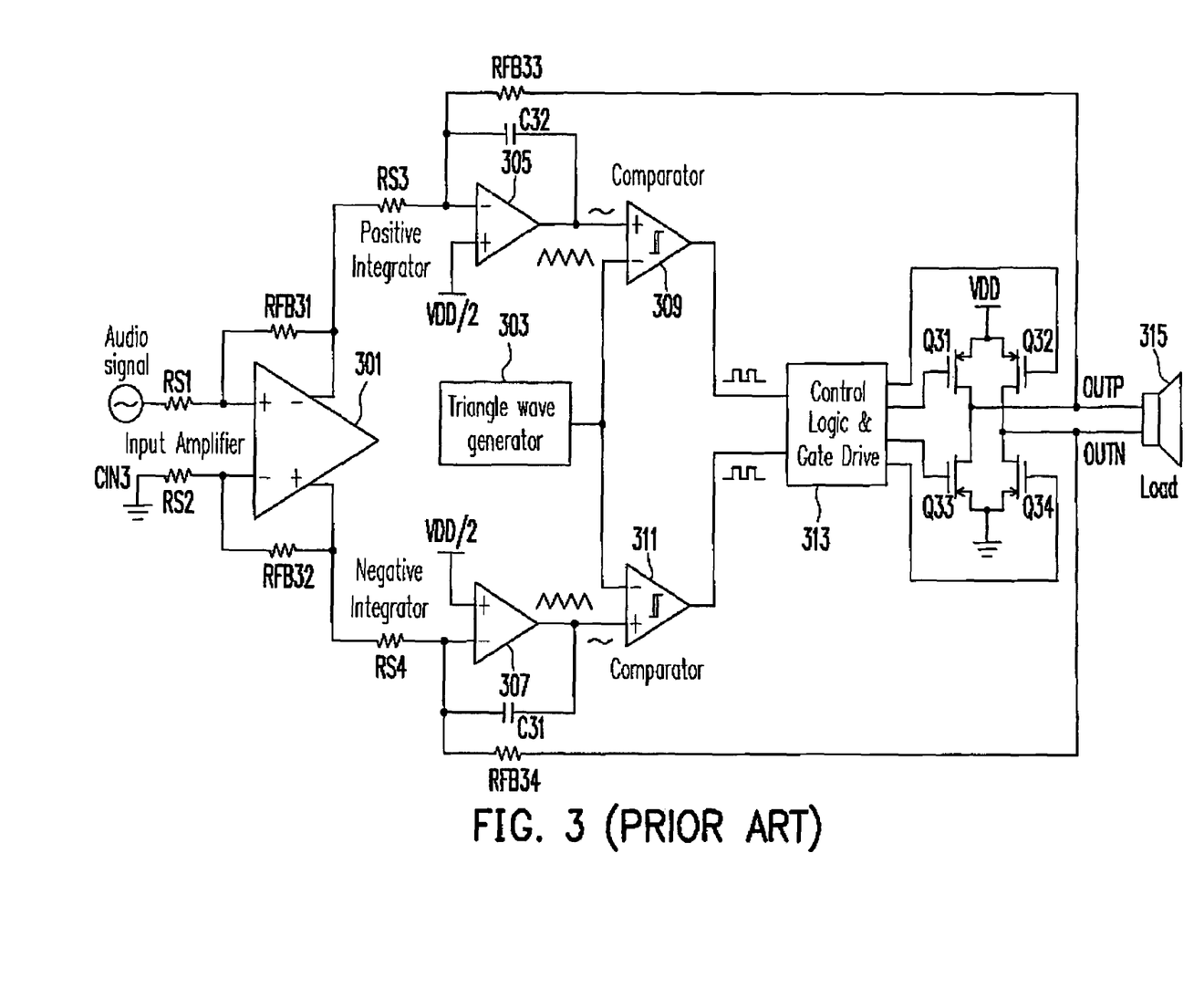
FIG. 3 shows a diagram of a traditional filterless class D amplifier.
Figure 4A:
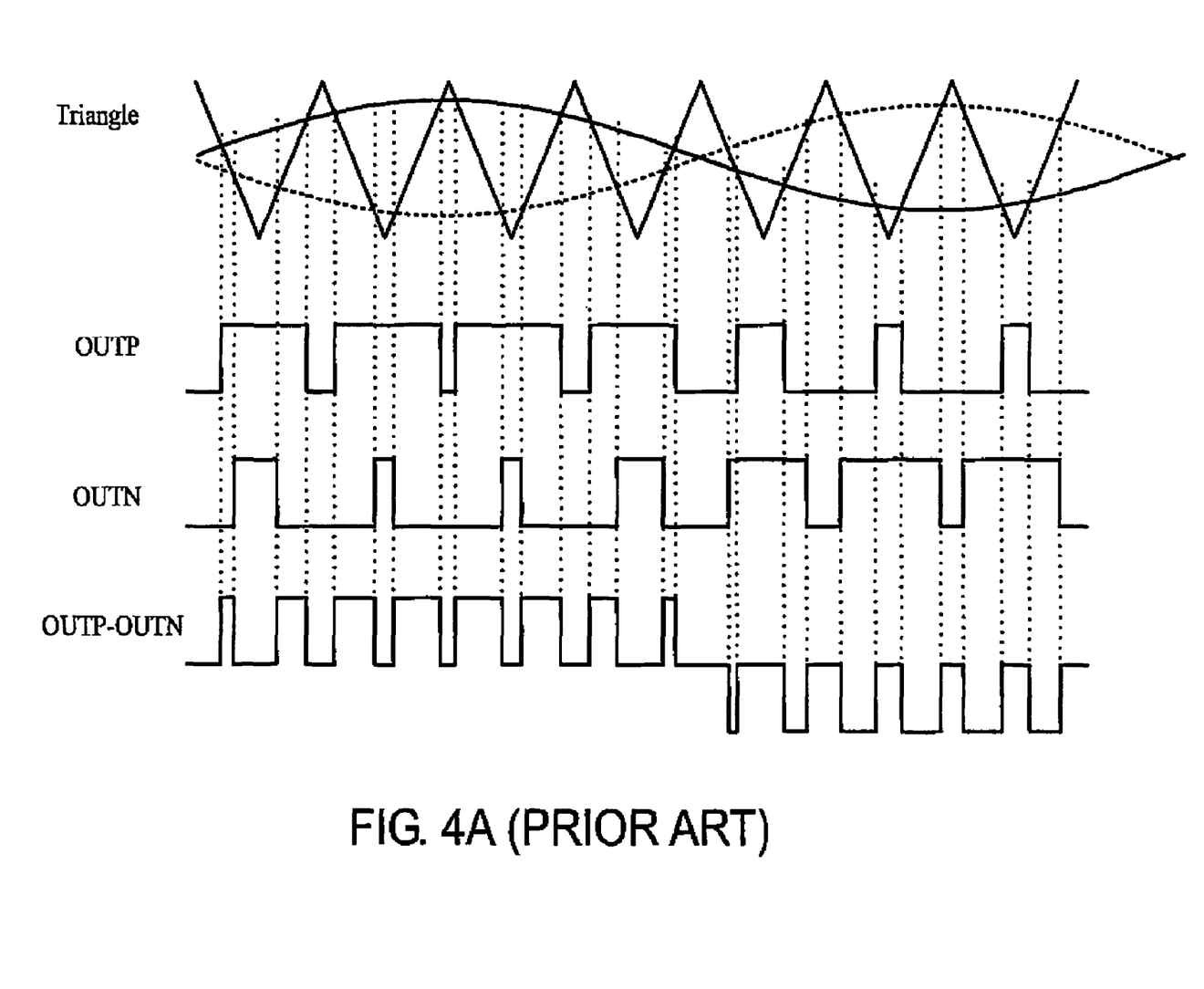
FIGS. 4A and 4B show waveforms of FIG. 3 when the input signal is large and small, respectively.
Figure 4B:
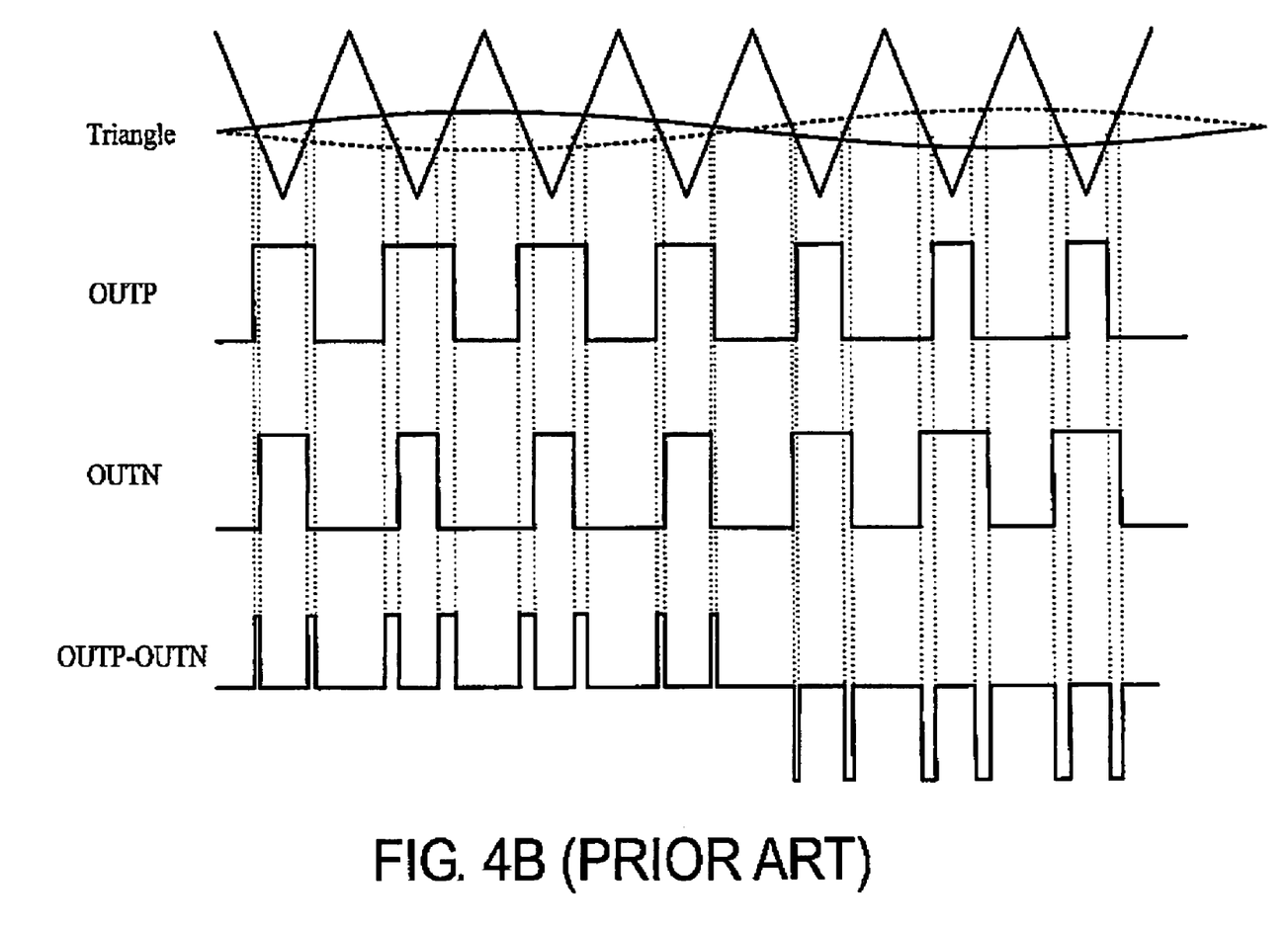

Class-D amplifiers are not popular in many portable products because the traditional class-D amplifier requires large LC filter, which increases size and solution cost. Filterless class-D amplifiers eliminate the output filter while keeping the efficiency benefit. The filterless modulation scheme brings class-D amplifiers approximately equal to class-AB amplifiers in cost and size, but still gains the great efficiency advantages. A traditional filterless class D amplifier is shown in FIG. 3. FIGS. 4A and 4B show waveforms of FIG. 3 when the input signal is large and small, respectively.

As shown in FIG. 3, the filterless class D amplifier for driving a load 315 at least includes capacitors CIN3, C31 and C32, resistors RS1~RS4 and RFB31~RFB34, a differential input amplifier 301, two integrators 305 and 307, a triangular wave generator 303, two comparators 309 and 311, a control logic & gate drive 313 and switching transistors Q31~Q34. This modulation scheme reduces EMI and does not have low-pass filters (that is why it is called "filterless"). This modulation scheme uses two integrators, which will increase quiescent currents, circuit size and solution cost.

Therefore, a new and highly efficient class D audio power amplifier is needed to overcome drawbacks in the known art.

SUMMARY OF THE INVENTION

One of the aspects of the invention is to provide a highly efficient filterless class D audio power amplifier.

Another aspect of the invention is to provide a filterless class D audio power amplifier with high audio quality.

Another aspect of the invention is to provide a filterless class D audio power amplifier with low or reduced EMI.

To at least achieve the above and other aspects, in one embodiment of the present invention, a filterless audio power amplifier for processing an input audio signal is provided. The filterless audio power amplifier has a differential output to drive load impedance. The filterless audio power amplifier includes: an error amplifier, the input audio signal coupled to the error amplifier; first and second reference wave generators, generating first and second reference waves; a first comparator, responsive to the first reference wave and the input audio signal; a second comparator, responsive to the second reference wave and the input audio signal; a switching unit, the operation states of the switching unit being decided based on output signals of the first and second comparators, the switching unit outputting the differential output; and a feedback unit, feed backing the differential output to the error amplifier, the error amplifier correcting the differential output in response to the input audio signal.

Beside, in another embodiment of the invention, an audio signal processing method for driving load impedance is provided. In the method, an input audio signal is introduced. A feedback differential output is error-amplified in response to the input audio signal. A first logic signal is generated in responsive to a first reference wave and the error-amplified output. A second logic signal is generated in responsive to a second reference wave and the error-amplified output. The differential output is generated based on the first and second logic signals. The load impedance is driven by the differential output.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 5:
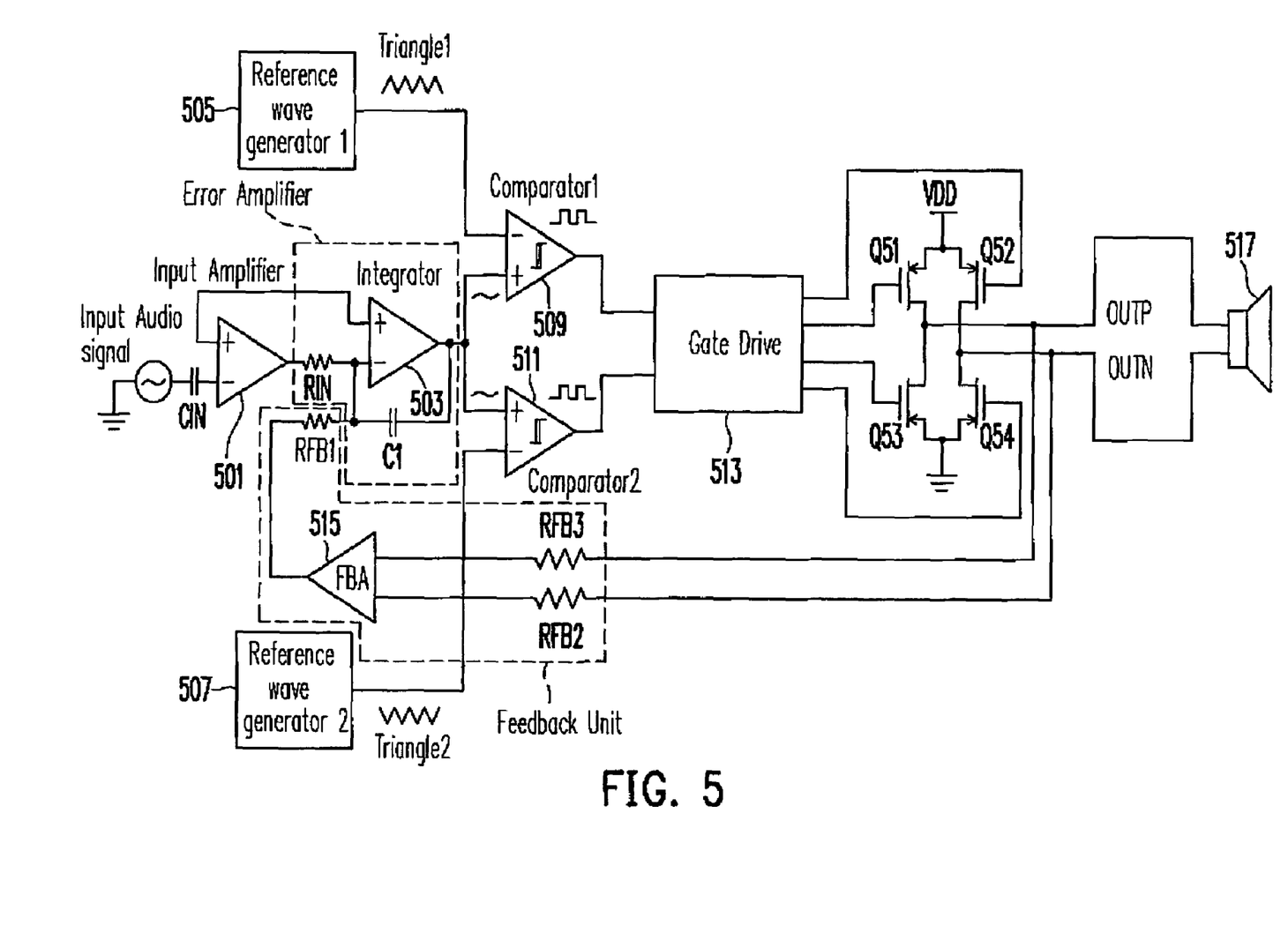
FIG. 5 shows a diagram of a filterless class D amplifier according to an embodiment of the present invention.

FIG. 5 shows a diagram of a filterless class D audio power amplifier for EMI reduction according to an embodiment of the present invention. The input audio signal is input into a negative input of an input amplifier 501 via a capacitor CIN. Input amplifier 501 pre-amplifies the input audio signal. Input amplifier 501 further has a positive input coupled to a positive input of an integrator 503. The output of input amplifier 501 is coupled into a negative input of integrator 503 via a resistor RIN. The output of integrator 503 is further fed-back into the negative input of integrator 503 via a capacitor C1. Integrator 503, resistor RIN and capacitor C1 constitutes an error amplifier for correcting differential output signals (OUTP and OUTN) of the class D audio amplifier in response to the (pre-amplified) input audio signal.

Figure 6:
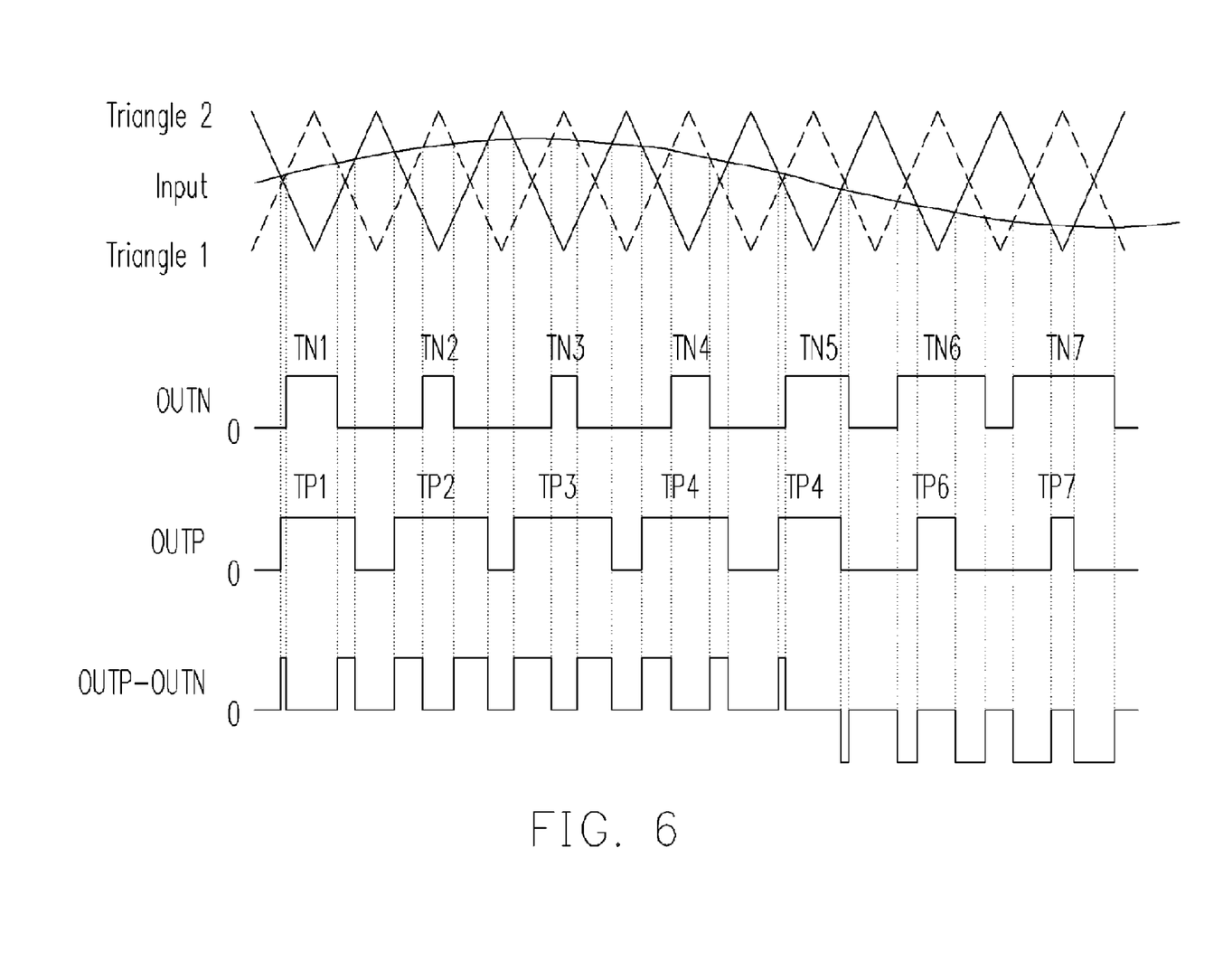
FIG. 6 shows waveforms of FIG. 5.

Two reference wave generators 505 and 507 generate reference waves respectively. For example, but not limited by, generators 505 and 507 respectively generate saw tooth (or triangular) reference waves Triangle 1 and Triangle 2. Reference waves Triangle 1 and Triangle 2 are symmetric and 180 degrees out of phase from each other. Waveforms of Triangle 1 and Triangle 2 are shown in FIG. 6. Of course, the phase relationship between the reference waves generated by the reference wave generators is not limited thereto. For example, the reference waves may be trailing edge ramp waves, leading edge ramp waves, or combination thereof. Reference wave Triangle 1 is coupled into a positive input of a comparator 509 and reference wave Triangle 2 is coupled into a negative input of a comparator 511. The output signal of the integrator (or said, the output signal of the error amplifier) is coupled into a negative input of comparator 509. Besides, the output signal of the integrator (or said, the output signal of the error amplifier) is also coupled into a positive input of comparator 511. As shown in FIG. 5, the output signal of the integrator (or said, the output signal of the error amplifier) is corresponding to or equivalent to the input audio signal.

As known, an output signal of a comparator goes high when the positive input is higher than the negative input. The output signal of comparator 509 goes high when reference wave Triangle 1 is higher than the output signal of integrator 503. Or equivalently, the output signal of comparator 509 goes high when reference wave Triangle 1 is higher that the input audio signal. Similarly, the output signal of comparator 511 goes high when the output signal of integrator 503 is higher than reference wave Triangle 2. Or equivalently, the output signal of comparator 511 goes high when the input audio signal is higher that reference wave Triangle 2. "HIGH" output signals of comparator 509 will result in pulses in output signal OUTN of the filterless class D audio power amplifier via gate drive 513 and switching transistors Q51~Q54. Similarly, "HIGH" output signals of comparator 511 will result in pulses in output signal OUTP of the filterless class D audio power amplifier via gate drive 513 and switching transistors Q51~Q54.

Output signals of comparators 509 and 511 are coupled to gate drive 513. Gate drive 513 drives or switches switching transistors Q51~Q54 based on the output signals of comparators 509 and 511. Configuration of gate drive 513 is not specifically limited here. Operation states of transistors Q51~Q54 are shown in FIGS. 7A~7D. Output signals OUTP and OUTN are obtained from terminals of transistors Q51~Q54. Pair of differential outputs OUTP and OUTN is used to drive a load 517. Load 517 is for example but not limited to, an audio speaker.

For more accurately driving load 517 in response to the input audio signal, output signals OUTP and OUTN are feedback to the error amplifier via feedback resistors RFB1~RFB3 and a feedback amplifier (FBA) 515. More specifically, output signal OUTP is coupled to FBA 515 via feedback resistor RFB3 and output signal OUTN is coupled to FBA 515 via feedback resistor RFB2. The output of FBA 515 is coupled to the negative input of integrator 503 via feedback resistor RFB1. Feedback resistors RFB1~RFB3 and FBA 515 constitute a feedback unit.

Via the embodiment, the audio input signals are more accurately played out by the speaker in high quality and high efficiency.

FIG. 6 shows waveforms of FIG. 5. For identification, Triangle 1 is in dot line. As discussed above, if the input signal is lower than Triangle 1, pulses TN1~TN7 . . . in OUTN are generated and the pulse widths thereof are related to the period during which the input signal is lower than Triangle 1. Similarly, if the input signal is higher than Triangle 2, pulses TP1~TP7 . . . in OUTP are generated and the pulse widths thereof are related to the period during which the input signal is higher than Triangle 2. (OUTP-OUTN), resulting from OUTP minus OUTN, represents a load driving signal for driving the load (speaker).

Figure 7A:
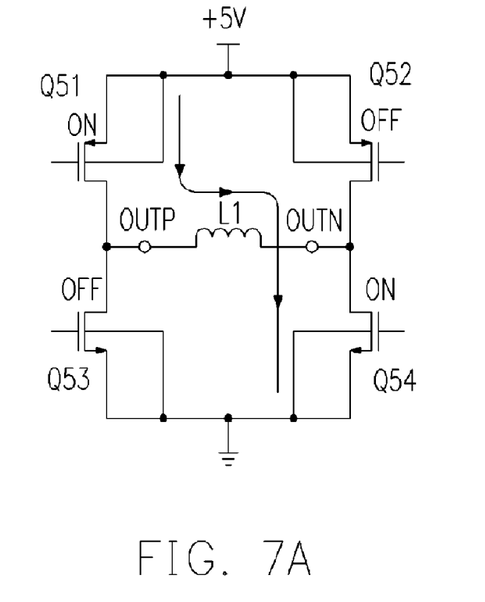
FIGS. 7A~7D show operation states of switching transistors of FIG. 5.
Figure 7B:
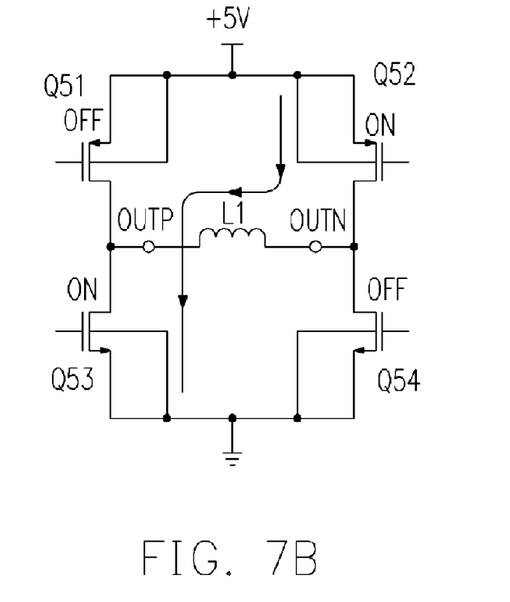
Figure 7C:
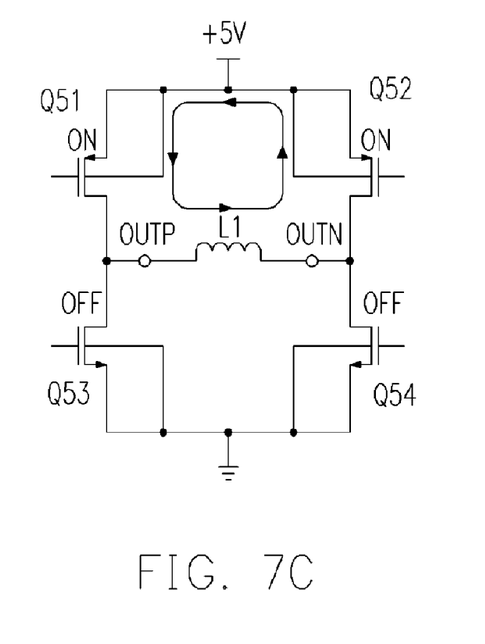
Figure 7D:
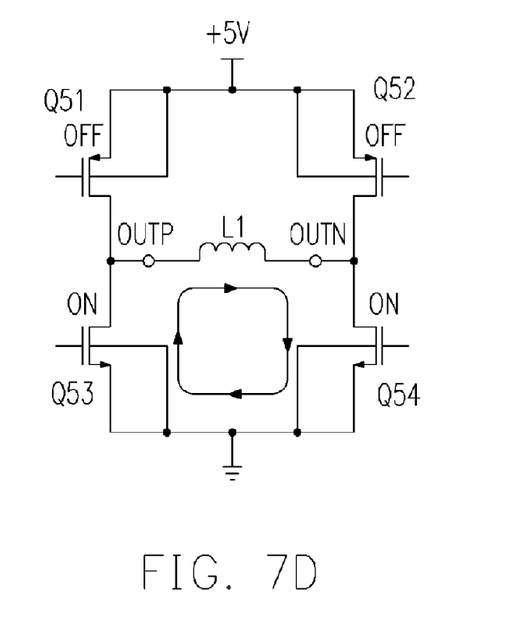

FIGS. 7A~7D show operation states of switching transistors of FIG. 5. In these figures, current flow is shown. More specifically, as shown in FIG. 5, transistors Q51~Q54 are controlled by the gate driver. In FIG. 7A, transistors Q51 and Q54 are turned on and transistors Q52 and Q53 are off to make a "H" OUTP and a "L" OUTN. In FIG. 7B, transistors Q52 and Q53 are turned on and transistors Q51 and Q54 are off to make a "L" OUTP and a "H" OUTN. In FIG. 7C, transistors Q51 and Q52 are turned on and transistors Q53 and Q54 are off to make both "H" OUTP and OUTN. In FIG. 7D, transistors Q53 and Q54 are turned on and transistors Q51 and Q52 are off to make both "L" OUTP and OUTN.

With this modulation scheme provided by the embodiment, the class D power amplifier does not need complex control logic and only needs an input amplifier to achieve well performance. This will reduce circuit size and cost and the circuit is easy to implement. The filterless power amplifier can reduce EMI. This double triangle wave modulation scheme allows a smaller and less expensive LC filter without increasing the quiescent current and reduces power consumption when the input audio signal is small. Furthermore, this double triangle wave modulation scheme has not only the advantages of the conventional ternary modulation scheme but also better power efficiency.

As used in the following description and claims, "integration" and "integrator" refers to the integration customarily found in the feedback loop of an audio feedback amplifier and not to the integration needed for phase or frequency compensation typically provided by inverters.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A filterless audio power amplifier for processing an input audio signal, the filterless audio power amplifier having a differential output to drive a load impedance, comprising:
    an error amplifier, the input audio signal coupled to the error amplifier;
    first and second reference wave generators, generating first and second reference waves;
    a first comparator, responsive to the first reference wave and the input audio signal;
    a second comparator, responsive to the second reference wave and the input audio signal;
    a switching unit, the operation states of the switching unit being decided based on output signals of the first and second comparators, the switching unit outputting the differential output, and
    a feedback unit, feeding back the differential output to the error amplifier, the error amplifier correcting the differential output in response to the input audio signal.

2. The filterless audio power amplifier of claim 1, further comprising an input amplifier having a negative input for receiving the input audio signal via a first capacitor, a positive input and an output for outputting the pre-amplified input audio signal to the error amplifier.

3. The filterless audio power amplifier of claim 2, wherein the error amplifier comprises:
    an integrator, having a positive input for coupling to the positive input of the input amplifier, a negative input for receiving the output of the input amplifier via a first resistor, and an output terminal, wherein the output terminal is further feedback to the negative input of the integrator via a second capacitor.

4. The filterless audio power amplifier of claim 1, wherein the first comparator has a negative input for receiving the output of the error amplifier and a positive input for receiving the first reference wave, and when the first reference wave is higher than the output of the error amplifier, a pulse is generated in a first output of the differential output.

5. The filterless audio power amplifier of claim 1, wherein the second comparator has a positive input for receiving the output of the error amplifier and a negative input for receiving the second reference wave, and when the second reference wave is lower than the output of the error amplifier, a pulse is generated in a second output of the differential output.

6. The filterless audio power amplifier of claim 3, wherein the feedback unit has:
    first, second and third feedback resistors; and
    a feedback amplifier for receiving the differential output via the second and third feedback resistors and generating an output to the negative input of the integrator via the first feedback resistor.

7. The filterless audio power amplifier of claim 1, wherein the first and second reference waves are triangular waves symmetric to each other.

8. The filterless audio power amplifier of claim 1, wherein the first and second reference waves are ramp waves having trailing edges.

9. The filterless audio power amplifier of claim 1, wherein the first and second reference waves are ramp waves having leading edges.

10. The filterless audio power amplifier of claim 1, wherein the load impedance is an audio speaker.

11. An audio signal processing method for driving a load impedance, the method comprising the steps of:
    introducing an input audio signal;
    feeding back an differential output to an error amplifier;
    the error amplifier error-amplifying the feedback differential output in response to the input audio signal;
    generating a first logic signal in responsive to a first reference wave and the error-amplified output;
    generating a second logic signal in responsive to a second reference wave and the error-amplified output;
    generating the differential output based on the first and second logic signals; and
    driving the load impedance by the differential output.

12. The method of claim 11, further comprising a step of: pre-amplifying the input audio signal.

13. The method of claim 11, wherein the step of generating the first logic signal includes a step of generating a pulse in a first output of the differential output when the first reference wave is higher than the error-amplified output.

14. The method of claim 11, wherein the step of generating the second logic signal includes a step of generating a pulse in a second output of the differential output when the second reference wave is lower than the error-amplified output.

15. The method of claim 11, wherein the first and second reference waves are triangular waves symmetric to each other.

16. The method of claim 11, wherein the first and second reference waves are ramp waves having trailing edges.

17. The method of claim 11, wherein the first and second reference waves are ramp waves having leading edges.

18. The method of claim 11, wherein the load impedance is an audio speaker.

* * * * *